United States Patent [19]

Saito

[11] Patent Number: 5,119,338

[45] Date of Patent: Jun. 2, 1992

[54] MEMORY DEVICE

[75] Inventor: Tamio Saito, Tokyo, Japan

[73] Assignee: Nippon Steel Corporation, Tokyo, Japan

[21] Appl. No.: 539,227

[22] Filed: Jun. 18, 1990

[30] Foreign Application Priority Data

Jun. 23, 1989 [JP] Japan .................................. 1-161662

[51] Int. Cl.$^5$ ............................................. G11C 13/00
[52] U.S. Cl. ...................................... 365/222; 365/52; 371/21.1
[58] Field of Search .................... 365/200, 222, 63, 52; 371/21

[56] References Cited

U.S. PATENT DOCUMENTS 5,027,327 1/1991 Kobayashi ........................ 365/222

Primary Examiner—Terrell W. Fears
Attorney, Agent, or Firm—Pollock, Vande Sande & Priddy

[57] ABSTRACT

A memory device for use with an external apparatus having a predetermined function is removably attached to the apparatus and comprises a connection portion for electrically removably connecting the memory device to the external apparatus; a memory portion for storing information supplied from the external apparatus through the connection portion so as to be accessible from the external apparatus, the memory portion being of a type which requires periodical refreshing of the stored information; a reproducing and holding circuit actuated in response to at least one predetermined signal supplied from the external apparatus through the connection portion to refresh the information stored in the memory portion; and an actuating circuit for actuating operation of the reproducing and holding circuit when the connection portion is electrically separated from the external apparatus, the actuating circuit including a power source for electrically energizing the reproducing and holding circuit and a signal generation circuit for generating, when the connection portion is separated from the external apparatus, a signal having the same function as that of the predetermined signal supplied from the external apparatus through the connection portion.

5 Claims, 5 Drawing Sheets

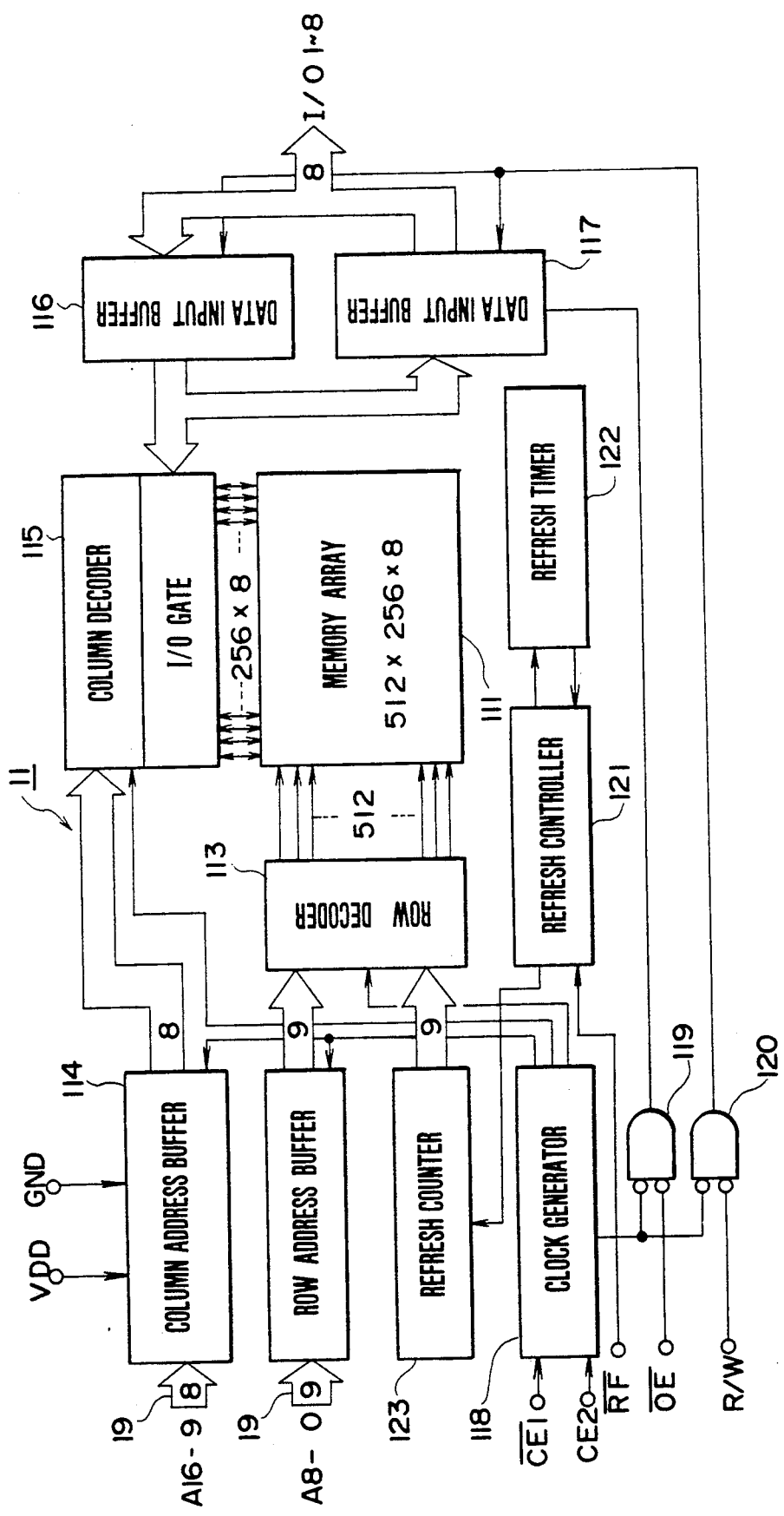

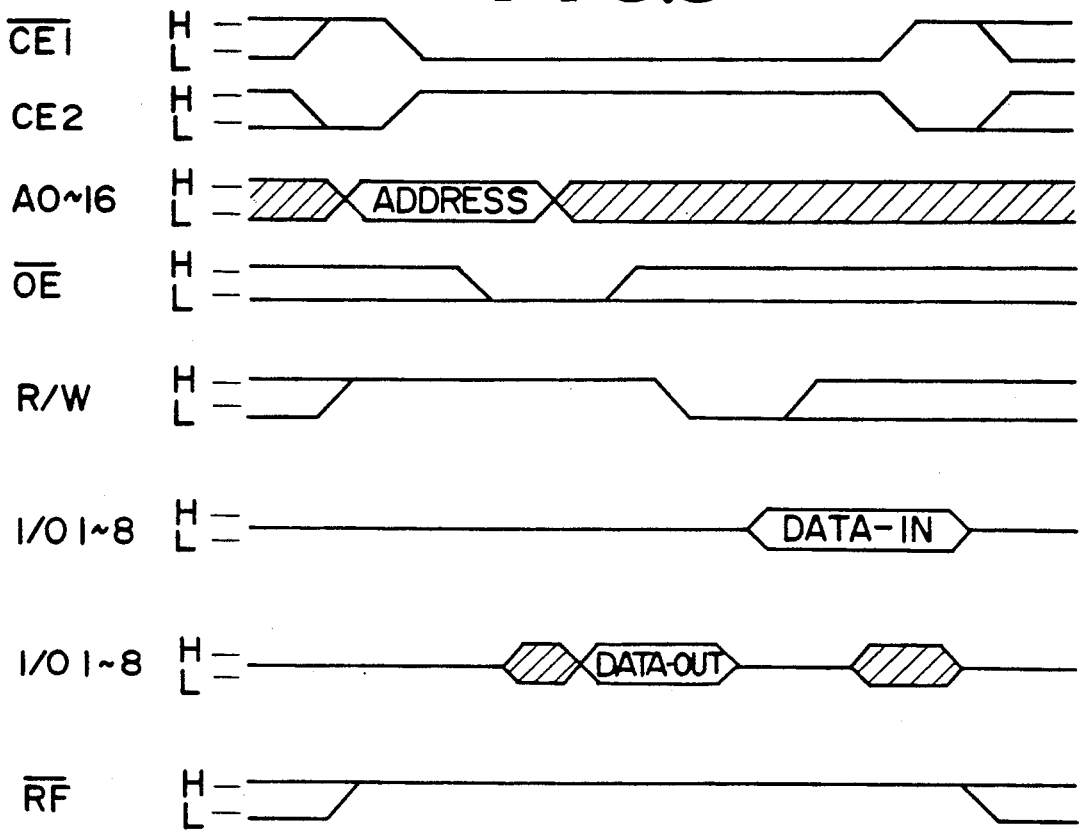
READ-AND-WRITE CYCLE  FIG. 3C
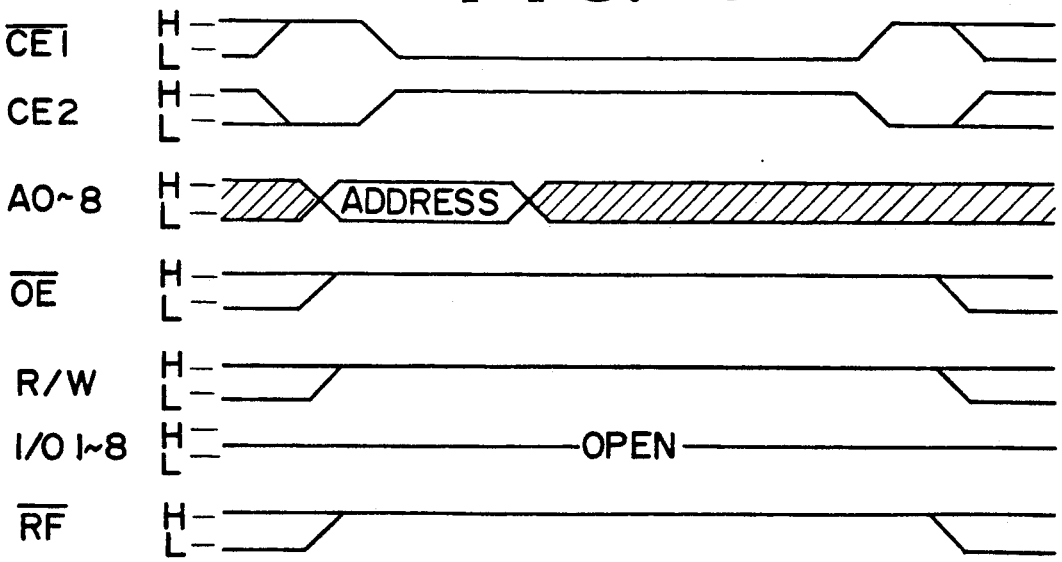
REGION REFRESH CYCLE  FIG. 4A

MEMORY DEVICE

BACKGROUND OF THE INVENTION

1. Field of the Invention

The present invention relates to a semi-conductor memory device removably attachable to an external circuit for performing data reading/writing operation, and particularly relates to a device such as a so-called IC card or memory card although the invention is not limited to an IC card or memory card.

2. Description of the Related Art

IC cards are generally divided into two types, one including at least computer function elements such as a CPU and a semiconductor memory so as to provide a high-degree data processing function such as arithmetic operation and the other including merely a semiconductor memory and a read/write control circuit, as shown in U.S. Pat. No. 4,888,773. The present invention relates to the IC cards of the latter type in view of the mode of practical use.

The conventional IC cards of the latter type are generally employing any of ROM, PROM, EEPROM, and S-RAM (static RAM), as a semiconductor memory. Due to difficulty in writing information readily and rapidly, the IC card employing ROM, PROM, or EEPROM is not suitable for use in the mode in which data is written data renewal) by a user after the card has been manufactured. On the other hand, the IC card using S-RAM is suitable for use in the mode in which data is written (rewritten) by a user because the data read/write operation can be carried out therein readily and rapidly in comparison with the IC card using PROM.

The S-RAM, however, involves a problem that the number of memory bits per chip area is so small that an IC card, that is, a memory device becomes expensive. The low memory density and expensiveness of S-RAM is generally a bar to reduction in size and cost of an IC card employing such an S-RAM when the IC card is used as temporary image-data-storing means, for example, such that image data of a CCD camera is written in the IC card, and the written data is inputted into a personal computer so as to be displayed on a CRT, to be subject to graphic processing, or to be recorded on a floppy disk, or the IC card is loaded on a reader of a printer so that the image stored in the memory is printed out.

In this regard, a dynamic RAM (D-RAM) is inexpensive and has a high memory density, and the dynamic RAM is suitable for the above uses in general. In the dynamic RAM, however, it is necessary to refresh the dynamic RAM periodically at a period not longer than a predetermined unit time so as to reproduce and hold the stored information. When an IC card is connected to an external circuit, that is, an apparatus for writing/reading data onto/from the IC card, such as an image data processing circuit of a CCD camera, an image data processing circuit of a personal computer, a reader of a printer, or the like, the data is not erased because the external circuit refreshes the dynamic RAM. In this case, however, if the IC card is separated from the external circuit, there is a problem that the data may disappear.

SUMMARY OF THE INVENTION

It is therefore an object of the present invention to provide a memory device which has a high memory capacity or high packing density, which is inexpensive, and which can be removably connected to an external circuit, and in which data can be prevented from disappearing when the memory device is separated from the external circuit.

Recently, there has been provided a large capacity, high-speed read/write and low power consumption memory IC having a dynamic RAM array in which a read/write control circuit and reproducing and holding means are included. The reproducing and holding means refreshes the dynamic RAM array when an electric signal of a predetermined mode is applied to an input terminal of the reproducing and holding means.

The memory device according to the present invention employs such a memory IC, and is provided with signal output means for supplying the electric signal of the predetermined mode to the reproducing and holding means when connection means for connecting the memory IC to an external circuit is in a state of non-connection.

The memory device according to the present invention comprises: storage means for storing information; connection means for connecting the memory device to be stored in the storage means or which processes the information read-out from the storage means; signal output means for producing a signal of a predetermined mode when the connection means is in a state of non-connection with the external circuit; reproducing and holding means for reproducing and holding the information stored in the storage means in response to the signals of the predetermined mode produced from the signal output means; and a power source for supplying an operation voltage to the reproducing and holding means and the storage means.

When the memory device is separated from the external circuit, the signal output means supplies the electric signal of the predetermined mode so that the reproducing and holding means refreshes, in other words, reproduces and holds, the contents stored in the storage means. Accordingly, if the memory device is separated from the external circuit, the contents are automatically refreshed. As a result, even when the memory device is separated from the external circuit, the data is continuously held through refreshing.

In the memory device according to the present invention, since the contents stored in the storage means can be automatically refreshed even when the memory device is separated from the external circuit, the storage means can be constituted by a dynamic RAM which provides high memory density at a low cost. Accordingly, for example, it is possible to provide a small-sized and inexpensive IC memory card, as an image memory, in which read/write can be carried out at a high speed.

BRIEF DESCRIPTION OF THE DRAWINGS

Other features and advantages of the present invention will be apparent from the following description taken in connection with the accompanying drawings, wherein:

FIG. 2 is a block diagram showing the internal function and configuration of the IC memory 11 depicted in FIG. 2;

FIG. 3C is a time-chart showing a read and write cycle in which read-out and write-in are performed in one and the same cycle, in the IC memory 11 depicted in FIG. 2;

FIG. 4A is a time-chart showing a refresh cycle of a first mode in the IC memory 11 depicted in FIG. 2;

DESCRIPTION OF THE PREFERRED EMBODIMENTS

Now the present invention will be described in detail with reference to the drawings.

Figure 1:
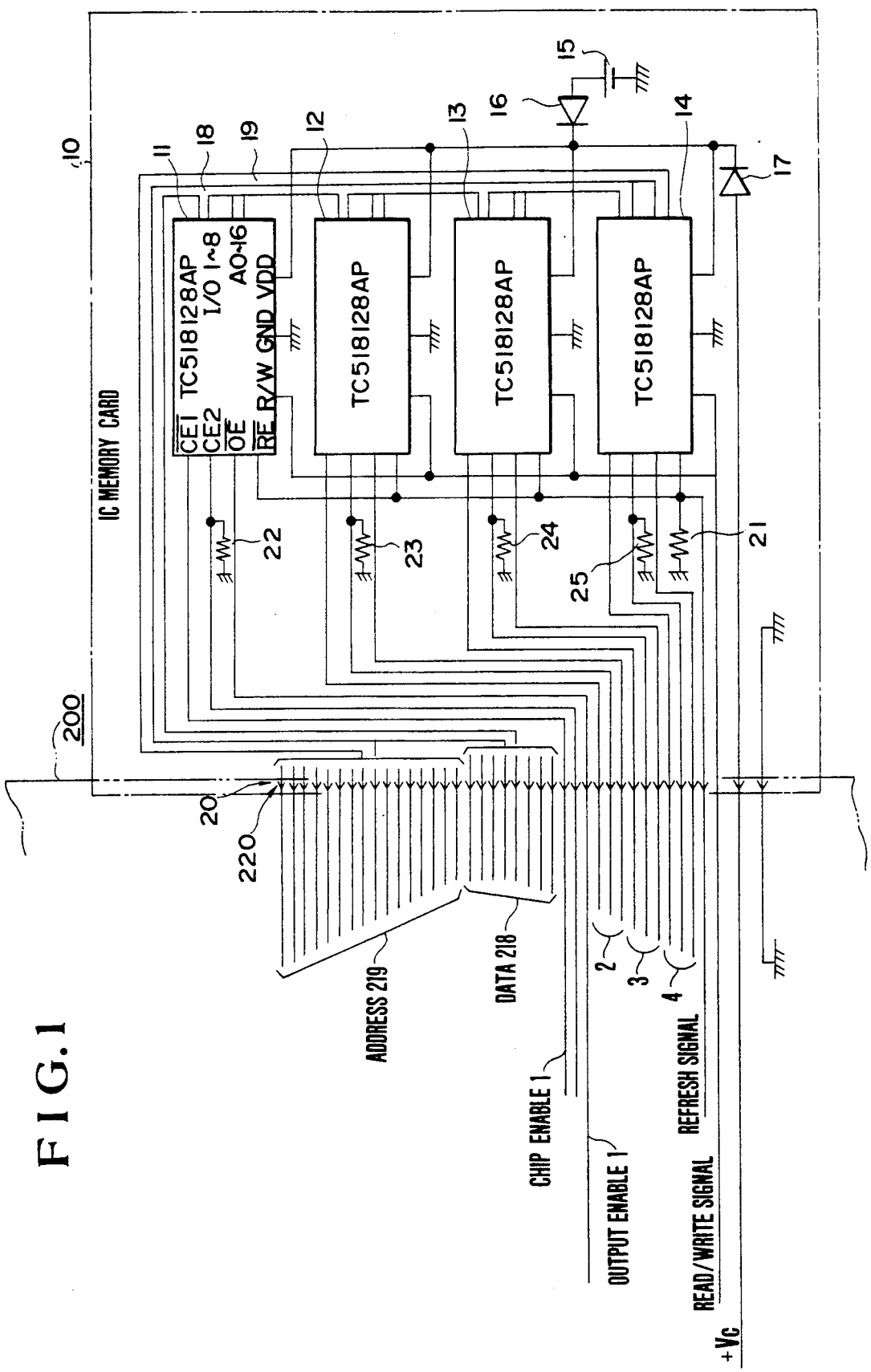
FIG. 1 is an electric circuit diagram showing the configuration of an embodiment of the present invention.

FIG. 1 shows a circuit configuration of an embodiment of the IC memory card according to the present invention. In a IC memory card 10, four IC memories 11-14 are mounted on a printed substrate and connected to a predetermined electric-conductor pattern formed on the printed substrate. In this embodiment, connector pins 20 are connected to the terminals of the electric-conductor pattern. Reception conductors 220 for receiving the respective connector pins 20 are connected to the terminals of data processing signal lines (including address lines for memory read/write control, data lines and control signal lines) of an external apparatus 200, such as a CCD camera a personal computer, an image-information reader of a printer, or the like, for writing data into the IC memory card 10 or reading the data from the IC memory card 10.

FIG. 2 shows the internal function and configuration of the IC memory 11. The IC memory 11 may be, for example, TC518128AP made by Toshiba Corp. In the IC memory 11, a memory array 111 is a dynamic RAM having a structure of 512×256 words×8 bits. The IC memory includes reproducing and holding means. The reproducing and holding means includes a refresh controller 121 for controlling the start of a refresh cycle in response to a refresh signal $\overline{RF}$ supplied from the external apparatus 200, a refresh timer 122 for controlling the time of the refresh controller 121, and a refresh counter 123. Because the structure of those circuits is known, the detailed description of the circuits will be omitted.

Figure 3A:
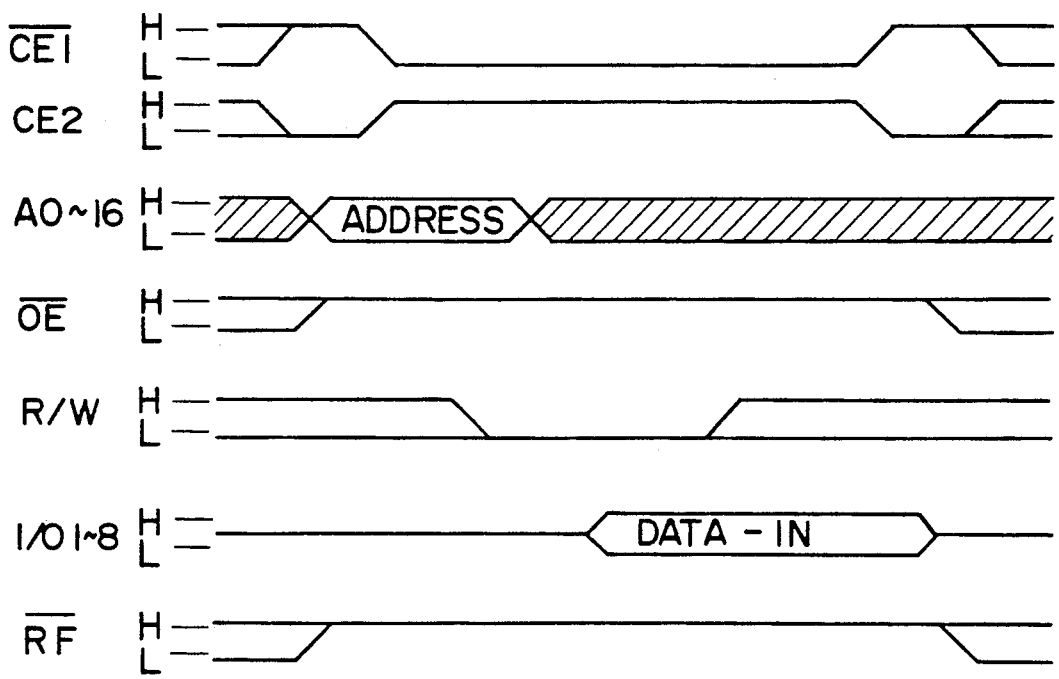
FIG. 3A is a time-chart showing a write-in cycle in the IC memory 11 depicted in FIG. 2.

Data writing into the memory array 111 is performed under the control by the control signals $\overline{CE1}$, CE2, $\overline{OE}$, R/W, and $\overline{RF}$ in a manner as shown in FIG. 3A.

The upper line attached to the control signal indicates the signal is active at its low level.

Figure 3B:
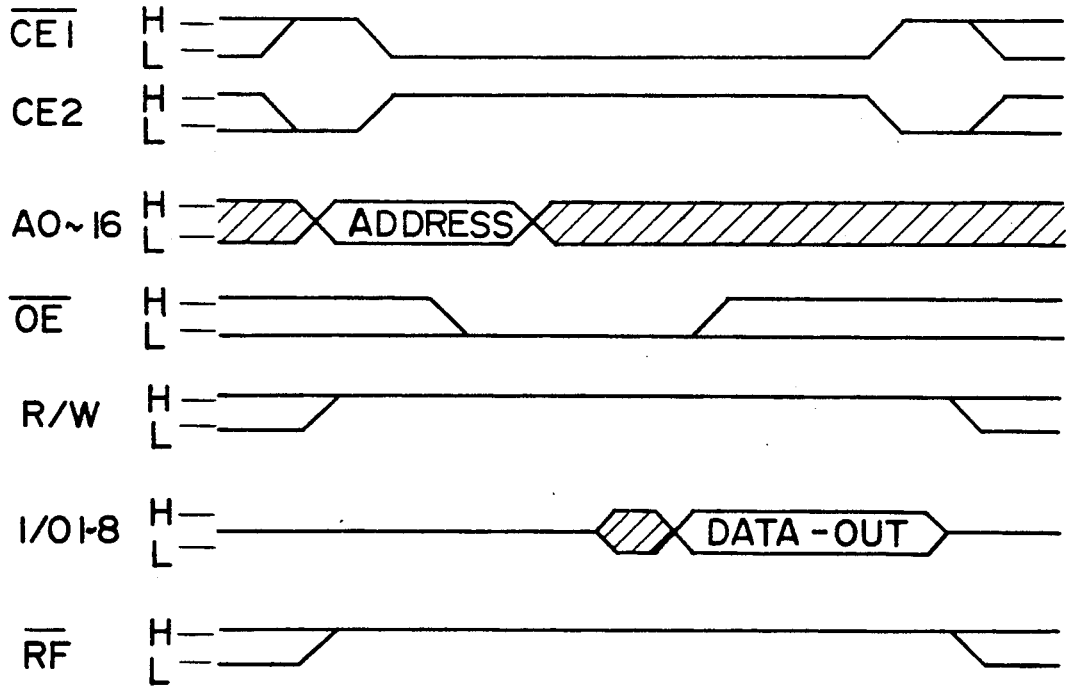
FIG. 3B is a time-chart showing a read-out cycle in the IC memory 11 depicted FIG. 2.

Data reading out of the memory array 111 is performed under the control by the control signals $\overline{CE1}$, CE2, $\overline{OE}$, R/W, and $\overline{RF}$ in a manner as shown in FIG. 3B.

When the control signals $\overline{CE1}$, CE2, $\overline{OE}$, R/W, and $\overline{RF}$ are controlled in a manner as shown in FIG. 3C, the IC memory 11 reads data in a cycle substantially equal to a read cycle and writes data into the address from which the data has been read out.

The signals $\overline{CE1}$ and CE2 are selection signals for actuating the IC chip to operate. The operation of the IC chip is controlled in accordance with a suitable combination of those selection signals. That is, the IC chip is enabled to operate only when the signal $\overline{CE1}$ is at a low level and the signal CE2 is at a high level. The signal $\overline{OE}$ is a signal for enabling a buffer 117 to operate so that when the signal $\overline{OE}$ takes a low level the buffer 117 is enabled to produce an output signal, while when the signal $\overline{OE}$ takes a high level the buffer 117 is enabled to receive an input signal. The signal R/W is a signal for selection of read and write in a manner so that read is selected when the signal R/W takes a high level while write is selected when it takes a low level.

Further, the signal I/O 1-8 is an 8-bit input/output signal. A signal is inputted from the outside in a period of <DATA-IN>, while a signal is outputted in a period of <DATA-OUT>. A signal AO-16 is an address signal for selecting one of cells in the memory array. After an address is designated at the timing of <ADDRESS> as shown in the drawings, data IN/OUT is designated by the I/O signal.

The signal $\overline{RF}$ designates the period of the refresh cycle in a manner such that the refresh cycle is carried out when the signal $\overline{RF}$ takes a low level. As seen from FIGS. 3A-3C, the signal $\overline{RF}$ takes a high level so that the refresh cycle is inhibited in a period where any one of the write and the read operations, is carried out. Before and after the period, the signal $\overline{RF}$ takes a The operation of the refresh cycle in accordance with the $\overline{RF}$ signal will be described hereunder.

In the IC memory 11 (for example, TC518128AP made by Toshiba Corp.), a clock generator 118, the refresh controller 121, the refresh timer 122, and the refresh counter 123 serve to refresh the memory array 111 in three modes.

In the first refresh mode, only a designated range of the memory array 111 is selectively refreshed. Specifically, as shown in FIG. 4A, under the condition that the signals $\overline{CE1}$, CE2, and $\overline{RF}$ are in low, high and low levels respectively, only the memory range designated by the address data (A0-A8) is refreshed.

Figure 4B:
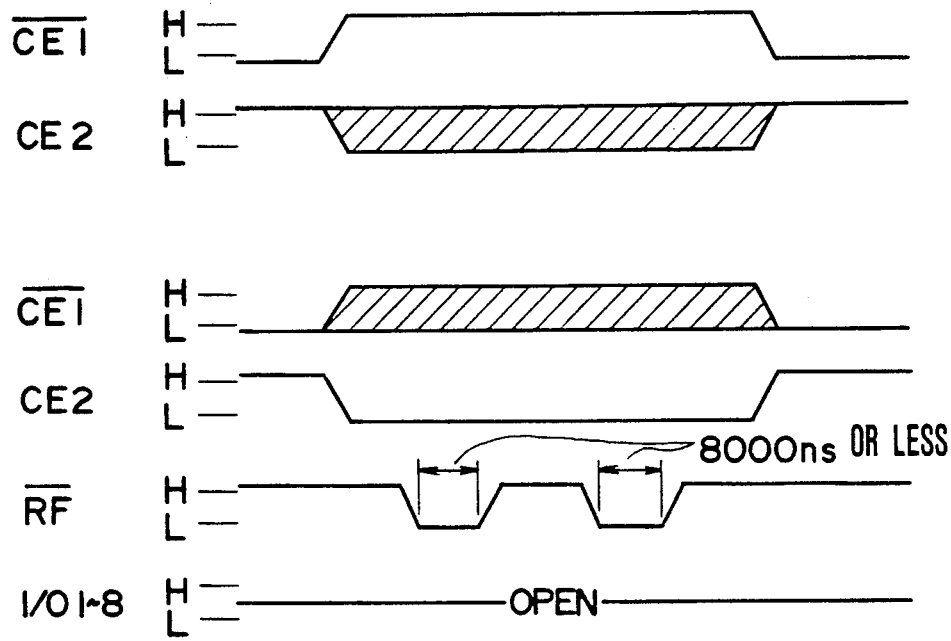
FIG. 4B is a time-chart showing the signal conditions for performing the refresh of a second mode in the IC memory 11 depicted in FIG. 2.

In the second refresh mode, the whole of the memory array 111 is refreshed. As shown in FIG. 4B, when a pulse signal of a low level comes to the $\overline{RF}$ terminal under the condition that the signal $\overline{CE1}$ is in a high level or the signal CE2 is in a low level, and the : duration of the signal $\overline{RF}$ of a low level is not longer than 8000 ns, the whole of the memory array 111 is refreshed in response to the pulse signal applied to the $\overline{RF}$ terminal.

Figure 4C:
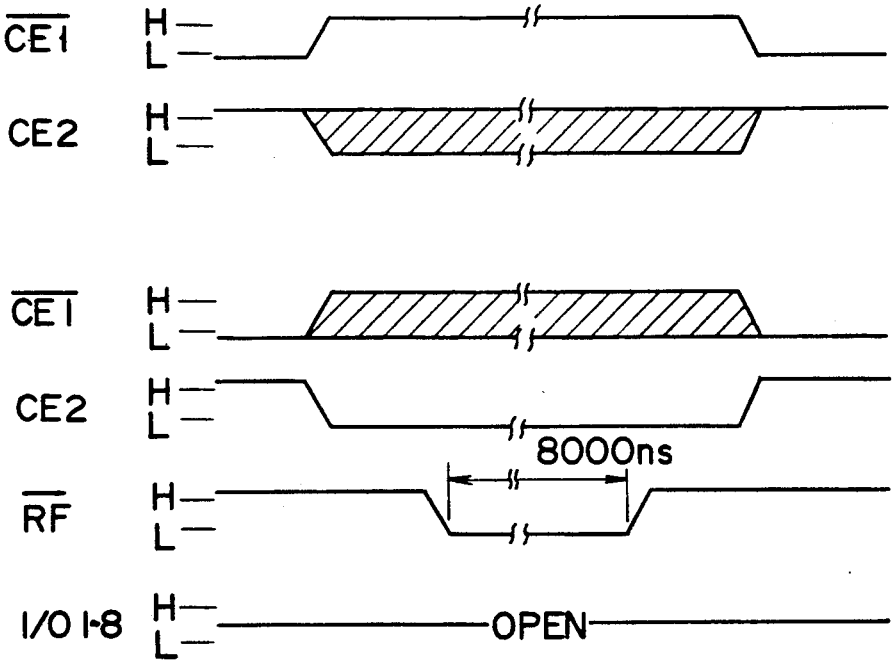
FIG. 4C is a time-chart showing the signal conditions for performing the refresh of a third mode in the IC memory 11 depicted in FIG. 2.

Also in the third refresh mode, the whole of the memory array 111 is refreshed. As shown in FIG. 4C, when the signal $\overline{RF}$ of a low level continues over 8000 ns, under the condition that the signal $\overline{CE1}$ is in a high level or the signal CE2 is in a low level, the whole of the memory array 111 is refreshed periodically at a predetermined period determined by the refresh timer 122.

Referring to FIG. 1 again, each of the IC memories 12-14 has the same configuration as that of the IC memory 11 and it operates in the same manner as the IC memory 11. Address lines (A0-A16) of the IC memories 11-14 are commonly connected to corresponding ones of the connector pins 20, and data lines (I/O1-I/O8) and refresh signal lines ($\overline{RF}$) of the Ic memories 11-14 are also commonly connected to corresponding ones of the connector pins 20. Source voltage lines (VDD) of the IC memories 11-14 are commonly connected to a primary battery 15 through a diode 16 and to a source connection pin of the pins 20 through a diode 17. Chip select signal lines ($\overline{CE1}$ and CE2) and an output select signal line ($\overline{OE}$) of the IC memories 11-14 are connected individually to corresponding ones of the connector pins 20. A common ground conductor of the printed substrate is also connected to a ground connector pin of the connector pins 20.

In this embodiment, in order to perform the refreshing, that is, the operation for holding the memory data stored in the memory array 111 in the third refresh mode when the IC memory card 10 is separated from the external apparatus 200, a common connection conductor line of the refresh signal lines ($\overline{RF}$) of the IC memories 11-14 is connected to the common ground conductor through a resistor 21, and the chip select signal lines (CE2) of the IC memories 11-14 are connected to the common ground conductor through resistors 22-24 respectively. Therefore, when the IC memory card 10 is separated from the external apparatus 200, the signal lines (CE2, $\overline{RF}$) are set at low level as shown in FIG. 4C. More specifically, when the connector pins 20 of the IC memory card 10 are separated from the reception conductors 220 of the external apparatus 200, the common refresh signal line ($\overline{RF}$) of the IC memories 11-14 is automatically made to take a low level and the respective chip selection signal lines (CE2) of the IC memories 11-14 are automatically made to take low levels individually. Accordingly, the condition of execution of the third refresh mode that the signal CE2 takes a low level and the signal $\overline{RF}$ in a low level continues over 8000 ns, is established in each of the IC memories 11-14 so that the refresh controller 121 refreshes the memory array 111 periodically at a predetermined period in each of the IC memories 11-14. Accordingly, the memory data of the memory array 111 is maintained so long as the battery 15 feeds a voltage within a predetermined range while the Ic memory card 10 is separated from the external apparatus 200.

In the embodiment, as described above, the arrangement is made such that a refresh command signal is generated by use of simple resistors when the IC memory card 10 is separated from the external apparatus 200. Accordingly, the configuration of the IC memory card is simple.

When the IC memory card 10 is connected to a data processing circuit of the external apparatus through the connector pins 20 and the reception conductors 220, the data processing circuit writes into or reads from the IC memory card 10 desired data and feeds refresh signals to the IC memory card 10 at predetermined timings. The external apparatus 200 continuously produces signals CE2=L and $\overline{RF}$=L to the IC memory card 10 when the external apparatus 200 is free from access to the IC memory card 10, so that the IC memory card 10 performs the refresh in the third refresh mode so as to hold the memory data. When the IC memory card 10 is connected to the external apparatus 200, a voltage +Vc of the source line of the external apparatus 200 is applied to the IC memories 1114 so that the power consumption of the battery 15 is small.

Although the primary battery 15 is used as source means of the IC memory card 10 in this embodiment, a secondary battery or a solar battery chargeable by a solar electric source may be used in place of the primary battery 15. Further, the connectors (connection pins 20 and reception conductors 220) may be of the contactless type in place of the contact type. As the IC memories 11-14, 524288 words×8 bits artificial S-RAMs, for example, HM658512 series made by Hitachi, Ltd. or any other artificial S-RAMs may be used.

In either event, when the memory device (10) is separated from the external circuit (200), the signal output means (21-25) supply electric signals in a predetermined mode (CE2 is in a low level and $\overline{RF}$ of a low level continues over 8000 ns) to the reproducing and holding means (118, 121-123) and the reproducing and holding means (121-123) refresh the dynamic RAM (111). Accordingly, when the memory device (10) is separated from the external apparatus circuit 200, refreshing is automatically performed and the data is continuously held through refreshing, when memory device (10) is separated from the external circuit (200).

Since the data of the memory device (10) is maintained even when the memory device (10) is separated from the external circuit (200) as described above, it is possible to inexpensively provide, for example, a small-sized high-speed read/write IC memory card as an image memory.

I claim:

1. A memory device for use with an external apparatus having a predetermined function to which said memory device is removably attached, said memory device comprising:

connection means for electrically removably connecting said memory device to said external apparatus;

storage means for storing information supplied from said external apparatus through said connection means so as to be accessible from said external apparatus, said storage means being of a type which requires periodical reproducing and holding of the stored information;

reproducing and holding means actuated to operate in response to at least one predetermined signal supplied from said external apparatus through said connection means so as to refresh the information stored in said storage means; and actuating means for actuating said reproducing and holding means when said connection means is electrically separated from said external apparatus, said actuating means including a power source for electrically aid reproducing and holding means and including generation means for generating, when said on means is separated from said external apparatus, a signal having the same function as that of said predetermined signal supplied from said external apparatus through said connection means.

2. A memory apparatus according to claim 1, in which said storage means includes a dynamic RAM.

3. A memory apparatus according to claim 1, further comprising a signal line for receiving said predetermined signal supplied from said external apparatus for actuation of said reproducing and holding means, said signal generation means including means giving said signal line a potential having substantially the same level as that of said predetermined signal.

4. A memory device for use with an external apparatus having a predetermined function to which said memory device is removably attached, said memory device comprising:

connection means for electrically removably connecting said memory device to said external apparatus;

storage means for storing information supplied from said external apparatus through said connection means so as to be accessible from said external apparatus, said storage means being of a type which requires periodical refreshing of the stored information, said storage means being actuated by an electric energy supplied from said external apparatus when said connection means is connected to said external apparatus; and means for supplying the electric energy for refreshing the information stored in said storage means when said connection means is electrically separated from the external apparatus.

5. A memory device according to claim 4, in which said storage means includes a dynamic RAM.

* * * * *